United States Patent [19]

Monticelli

[11] 4,339,728
[45] Jul. 13, 1982

[54] RADIO RECEIVER SIGNAL AMPLIFIER AND AGC CIRCUIT

[75] Inventor: Dennis M. Monticelli, Fremont, Calif.

[73] Assignee: National Semiconductor Corporation, Santa Clara, Calif.

[21] Appl. No.: 120,209

[22] Filed: Feb. 11, 1980

[51] Int. Cl.³ .............................................. H03F 3/45
[52] U.S. Cl. ................................... 330/254; 330/257; 330/288
[58] Field of Search ............... 330/254, 257, 279, 280, 330/288; 455/242, 253

[56] References Cited
U.S. PATENT DOCUMENTS 4,143,331  3/1979  Page .................................. 330/280 X

*Primary Examiner*—James B. Mullins
*Attorney, Agent, or Firm*—Gail W. Woodward; James A. Sheridan; Neil B. Schulte

[57] ABSTRACT

An integrated circuit is employed to provide a high gain signal amplifier having an automatic gain control function and an output suitable for driving signal detection circuitry in a radio receiver. The circuit operates at the receiver intermediate frequency. A gain controlled cascode amplifier drives one input of a high gain differential amplifier. The other input is returned to a reference potential. A pair of current mirrors are coupled into the differential amplifier to provide a pair of single ended outputs. One output drives a peak rectifying diode to operate the automatic gain control and the other output drives a signal detection circuit. The current mirrors are ratioed so that the automatic gain control threshold is a predetermined fixed multiple of the signal threshold.

9 Claims, 3 Drawing Figures

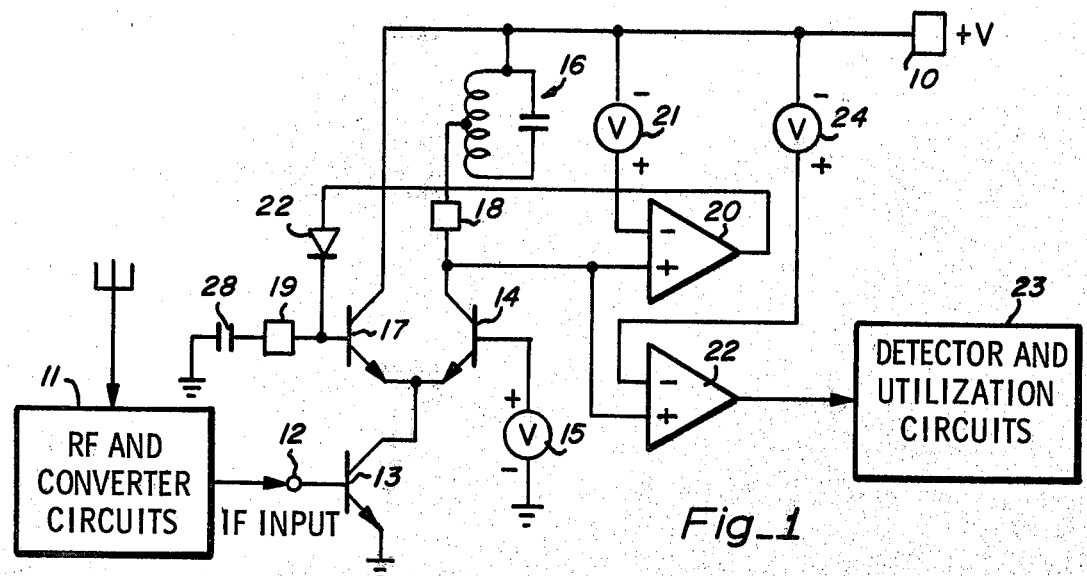
Fig_1
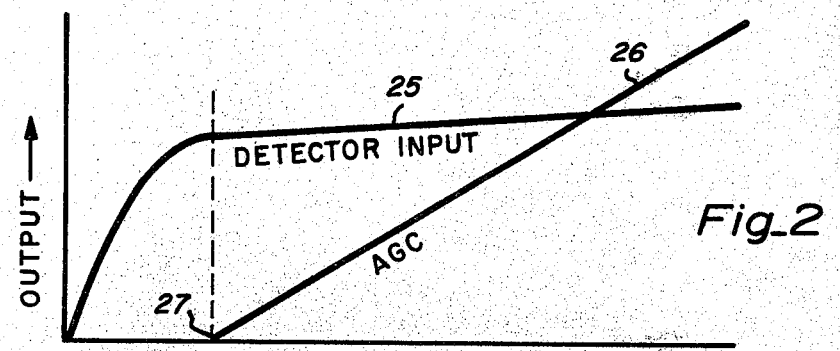
Fig_2
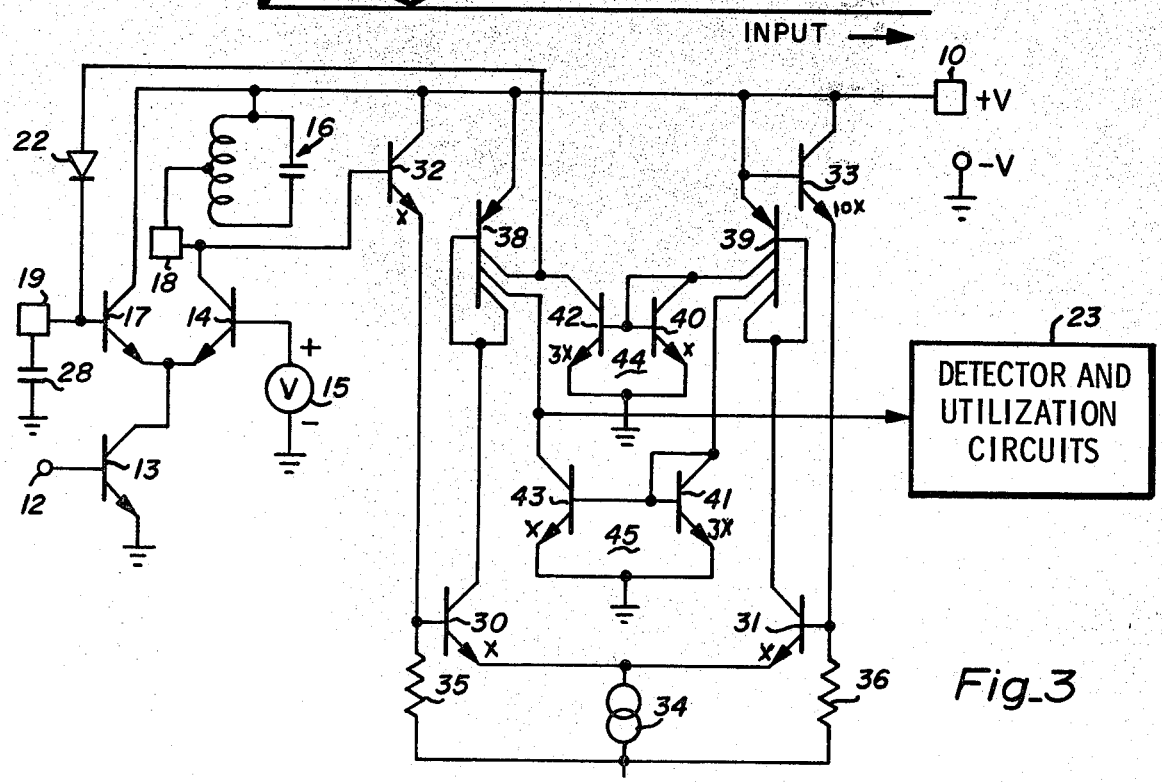
Fig_3

RADIO RECEIVER SIGNAL AMPLIFIER AND AGC CIRCUIT

BACKGROUND OF THE INVENTION

The invention is related to the intermediate frequency (IF) amplifiers used in radio receivers. An automatic gain control (AGC) function is typically employed in a receiver to keep the IF signal level substantially constant above a particular threshold value. Desirably, the amplifier is responsive to signals of lower level down to some lower signal threshold value. In particular, the invention is related to a monolithic integrated circuit (IC) that is designed to minimize parts exterior to the IC chip. This has the effect of reducing the IC pin count and takes advantage of the economies of IC construction.

SUMMARY OF THE INVENTION

It is an object of the invention to provide an IF amplifier in IC form having the capability of driving an AGC detector and a signal detector so that the AGC threshold is a fixed ratio with respect to the signal threshold.

It is a further object of the invention to provide an IC form of IF amplifier suitable for constructing a sensitive radio receiver employing a single tuned amplifying stage.

It is still a further object of the invention to control the signal to AGC threshold ratio in a radio receiver as a function of device area ratioing in an IC.

These and other objects are achieved in the following manner. A single stage tuned IF amplifier in a radio receiver is coupled to drive one input of a high gain differential amplifier. The other input is returned to a reference potential. The differential amplifier includes a pair of current mirror loads to separately drive AGC and signal detectors. Each of the current mirrors is ratioed. The mirror driving the AGC detector is configured to reduce the drive while the mirror driving the signal detector is configured to increase the drive. Since this ratioing can be achieved by transistor area design, the threshold ratio can be determined by geometrical factors which can be closely controlled.

BRIEF DESCRIPTION OF THE DRAWING

FIG. 1 is a simplified block-schematic diagram illustrating the operation of the invention;

FIG. 2 is a graph showing the relationship between AGC and signal response of the circuit of FIG. 1; and FIG. 3 is a schematic diagram of the circuit of the invention.

DESCRIPTION OF THE INVENTION

In the following description the transistors are of conventional monolithic IC construction. The NPN devices are of double diffused vertical construction and the PNP devices are of lateral construction. The square symbols denote IC chip pads which provide for external connections.

FIG. 1 is a combined block schematic diagram of a radio receiver illustrating the invention. In the diagram, the square terminals are intended to represent IC chip pads and components connected thereto can be off chip parts. The circuit is powered from a supply connected between the positive rail at terminal 10 and ground.

Conventional radio receiver RF and converter circuitry shown at block 11 produce an IF signal at terminal 12. The IF signal drives a cascode-connected tuned IF amplifier. Transistors 13 and 14 are cascode connected. Common base connected transistor 14 is base biased at a reference potential by voltage source 15. Tank circuit 16, turned to the IF, returns the collector of transistor 14 to the positive supply rail.

Transistor 17 controls the gain of the cascode IF amplifier as a function of its base voltage by shunting a portion of the current flowing in transistor 13 around transistor 14. If the base of transistor 17 is at the same potential as voltage source 15, the current in transistor 13 will be split equally in transistors 14 and 17. As the potential at the base of transistor 17 rises, it conducts more heavily and thereby reduces the gain of the cascode amplifier. Reducing the potential at the base of transistor 17 has the opposite effect.

The collector of transistor 14 is directly connected to the non-inverting input of operational amplifier (op amp) 20. The inverting input is returned to the positive supply rail through a 88 mv voltage source 21 poled as shown. Since tank circuit 16 returns the inverting input of op amp 20 to the positive supply rail under no signal or quiescent conditions the output of op amp 20 will be biased low by voltage source 21.

It can be seen that the output of op amp 20 will remain low until the peak IF voltage at the collector of transistor 14 exceeds 88 mv. When the non-inverting input of op amp 20 receives in excess of 88 mv positive peaks, the output will go high with each IF cycle. Diode 22 in conjunction with capacitor 28 forms a positive peak signal rectifier that controls the potential at the base of transistor 17. Thus, when a signal is present at terminal 12 that is sufficient to produce in excess of 88 mv at the collector of transistor 14, the voltage at the base of transistor 17 will rise, thereby reducing the gain of the cascode amplifier. Thus, once the 88 mv threshold is achieved, the signal at the collector of transistor 14 will not increase further to any appreciable extent.

The signal at the collector of transistor 14 is also fed to the noninverting input of op amp 22, the output of which drives detector and utilization circuits 23. In a typical digital system, the detector will be a digital device and the utilization circuits often include decoder circuitry. Those circuits inside block 23 do not form any part of the present invention.

Op amp 22 has its inverting input coupled to voltage source 24 which provides a level 31 mv above the positive supply rail. While op amp 22 is similar to op amp 20, its input has a 31 mv threshold. That is, the output will go higher when the signal peaks at the collector of transistor 14 exceed 31 mv. Thus the signal detector (in block 23) will receive signals having a threshold substantially below the AGC threshold. Both thresholds are established by $\Delta V_{BE}$ voltage sources.

FIG. 2 is a graph illustrating the above-described circuit functions. The graph ordinate represents input signal strength and the abscissa is in arbitrary units of op amp output. Curve 25 represents the output of op amp 22, and curve 26 represents the output of op amp 20 but to a different scale. The origin of curve 25 is arbitrarily set to the 31 mv threshold for op amp 22. Once the input signal exceeds this level, the output will rise rapidly until the threshold of op amp 20 is exceeded at point 27 whereupon AGC action is present. As the voltage at the output of op amp 20 rises, there is very little further increase in output from op amp 22. The difference in the two slopes of curve 25 is a function of the AGC loop gain.

FIG. 3 shows a schematic implementation for an IC of the circuits between blocks 11 and 23 of FIG. 1. Where similar parts are illustrated, they will bear the same numbers. Op amps 20 and 22 have been combined into a single high gain differential amplifier which has built-in reference voltage sources as will be described hereinafter. Since tank circuit 16 and capacitor 28 are off-chip components, IC pads 18 and 19 are shown for their interconnections.

Transistors 30–33 comprise a high gain differential amplifier. Current source 34 supplies the amplifier tail current. Resistors 35 and 36 are load resistors for the emitter follower input transistors 32 and 33 respectively. The emitter follower input stages cause the amplifier to respond as a very high transconductance voltage to current converter. The collector currents of transistors 30 and 31 provide a differential current output related to the signal voltage at the collector of transistor 14.

It will be noted that the second input terminal of the differential amplifier is the base of transistor 33 which is returned to the positive supply rail. Furthermore, the emitter of transistor 33 is made to have ten times the area of transistor 33 (as indicated by the 10X designation). This means that for zero signal conditions where both input transistor bases are at the positive supply rail potential, transistor 32 will have ten times the current density of transistor 33. This assumes that resistors 35 and 36, which determine the currents in transistors 32 and 33, are of equal value. The differential current density will cause the emitter potential of transistor 32 to be lower than that of transistor 33 by about 60 mv at 300° K. This means that in order to balance conduction in transistors 30 and 31, which are of equal emitter areas, the potential at the collector of transistor 32 will have to rise to 60 mv above the supply rail potential.

Transistors 38 and 39 constitute load devices for transistors 30 and 31 respectively. Each transistor 38 and 39 is typically of PNP lateral construction having three separate collectors of equal collection. One collector in each is coupled to its base and to either transistor 30 or 31 as shown. Thus, in transistor 39 two outputs each equal to the collector current of transistor 31 are connected respectively to diode connected transistors 40 and 41. It will be noted that transistors 40 and 42 comprise a first current mirror 44 while transistors 41 and 43 comprise a second current mirror 45. Each of these mirrors affords a single ended output for the high gain differential amplifier. Current mirror 44 provides the output that drives diode 22 for the AGC function. Current mirror 45 provides the output that drives the detector circuit in block 23.

In current mirror 44, it can be seen that transistor 42 has three times the emitter area of transistor 40, thus providing a current gain of 3. Transistor 41 has three times the area of transistor 43 thereby giving current mirror 45 a current gain of $\frac{1}{3}$ (a loss of 3).

The assess the circuit operation, assume the 300° K. condition where the collector of transistor 14 is signal driven 60 mv above the supply rail potential and the currents in transistors 30 and 31 are equal. In current mirror 44, transistor 40 will attempt to force transistor 42 to conduct three times the current available from the collector of transistor 38. Thus it can be seen that no current will flow into diode 22. In fact it can be seen that the potential at the collector of transistor 14 will have to be driven more than 60 mv above the supply rail potential before any output current will be available to diode 22. This threshold condition for the AGC operation will be related to the transistor areas as a $\Delta V_{BE}$ condition in accordance with the following. The $\Delta V_{BE}$ for the high gain differential amplifier input devices 32 and 33 will be:

$$V_{BE\,IN} = kT/q \ln\left(\frac{A33}{A32}\right) \quad (1)$$

where:
k = Boltzmann's constant
T = Absolute temperature
q = Electron charge
A32, A33 = Areas of reference transistors The output threshold for current mirror 44 will be:

$$T_{AGC} = kT/q \ln\left(\frac{A33}{A32} \cdot \frac{A42}{A40}\right) \quad (2)$$

For the area ratios shown in FIG. 3, the AGC threshold will be about 88 mv at 300° K.

The output threshold for current mirror 45 will be:

$$T_{SIG} = kT/q \ln\left(\frac{A33}{A32} \cdot \frac{A43}{A43}\right) \quad (3)$$

For the area ratios shown in FIG. 3 the signal threshold will be about 31 mv at 300° K.

The ratio of AGC threshold to signal threshold will be:

$$T_{RATIO} = \frac{\ln\frac{A33}{A32} \cdot \frac{A42}{A40}}{\ln\frac{A33}{A32} \cdot \frac{A43}{A41}} \quad (4)$$

It is to be noted that the temperature responsive terms have dropped out and the threshold ratio determined only by area ratios. For the area ratio shown in FIG. 3, the threshold will be about 2.8 to 1. In terms of FIG. 2, point 27 will be at a voltage equal to 2.8 times the origin voltage of curve 25.

EXAMPLE

The circuit of FIG. 3 was constructed using conventional monolithic IC components. The NPN transistors were conventional double diffused vertical devices having Beta values in excess of 200. All of the NPN transistors had the same emitter area except for transistors 33, 41, and 42, which had larger areas as shown. The PNP transistors were of high gain lateral construction, each having three equal separate collectors. The following component values were used:

| Part | Value | Units |
|---|---|---|
| Tank 16 | 455 | KHz |
| Capacitor 28 | 0.1 | Microfarad |
| Source 15 | 1.3 | Volts |
| Source 34 | 125 | Microamperes |
| Resistors 35 and 36 | 25 | Kohms |

Using a 6 volt supply, the amplifier had a mixture gain of 60 db from terminal 12 to the collector of transistor 43. The AGC range was about 60 db. The detector threshold ratio was about 2.8:1.

The circuit was used in a digital pulse responsive radio receiver. The AGC time constant was selected so that the interpulse decay of AGC voltage was small.

The invention has been described and a working example given. There are alternatives and equivalents that will occur to a person skilled in the art upon reading the foregoing description. Accordingly, it is intended that the scope of the invention be limited only by the claims that follow.

I claim:

1. A combined signal amplifier and automatic gain control (AGC) circuit for use in a radio receiver responsive to a modulated carrier signal to produce a signal output characteristic of the modulation on said carrier signal, said receiver having an AGC with a threshold higher than the threshold of response to said carrier signal, said circuit comprising:
   a differential amplifier having a first input coupled to a source capable of supplying said modulated carrier signal within said receiver, a second input coupled to a source of reference potential, and first and second differential outputs;
   a first current mirror load coupled to said first differential output and having a single ended output coupled to an AGC detector;
   a second current mirror load coupled to said second differential output and having a single ended output coupled to a signal detector; and
   means within said first and second current mirror loads for ratioing the thresholds of said AGC detector and said signal detector.

2. The circuit of claim 1 wherein said first current mirror is configured to produce a reduced output to said AGC detector whereby said signal detector has a lower threshold than said AGC detector.

3. The circuit of claim 2 wherein said first input is driven from a tuned amplifier stage.

4. The circuit of claim 3 wherein said first current mirror is coupled to a detector that biases said tuned amplifier stage.

5. A differential amplifier comprising:
   first and second supply rails connectible to a source of operating voltage;
   first and second transistors having emitter electrodes coupled together and returned through current supply means to said second supply rail, collector electrodes returned through first and second plural output load means to said first supply rail, and base electrodes;
   first and second emitter followers having emitters coupled respectively to said bases of said first and second transistors, collectors returned to said first supply rail and bases comprising differential input terminals for said amplifier;
   first current mirror means coupled to said plural output load devices to provide a first single ended output from said amplifiers;
   second current mirror means coupled to said plural output load devices to provide a second single ended output from said amplifier; and
   means for providing different threshold values for said first and second single ended outputs in response to a single input signal.

6. The amplifier of claim 5 wherein said single input signal is coupled to said base of said first emitter follower and said base of said second emitter follower is returned to a reference potential.

7. The amplifier of claim 6 wherein said means for providing different threshold values comprise ratioing at least one of said first and second current mirror means.

8. The amplifier of claim 7 wherein emitter followers employ transistors having ratioed emitter areas.

9. The amplifier of claim 8 wherein both of said first and second current mirror means are ratioed with said ratioing operating in opposite directions thereby producing different output threshold values.

* * * * *